(12) United States Patent
Kim et al.

(10) Patent No.: US 11,217,544 B2
(45) Date of Patent: Jan. 4, 2022

(54) SEMICONDUCTOR PACKAGE INCLUDING A SEMICONDUCTOR CHIP HAVING A REDISTRIBUTION LAYER

(71) Applicant: SK hynix Inc., Icheon-si (KR)

(72) Inventors: Jong Hyun Kim, Icheon-si (KR); Seung Hwan Kim, Icheon-si (KR); Hyun Chul Seo, Icheon-si (KR); Ki Young Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/002,422

(22) Filed: Aug. 25, 2020

(65) Prior Publication Data

US 2021/0366853 A1 Nov. 25, 2021

(30) Foreign Application Priority Data

May 25, 2020 (KR) .......................... 10-2020-0062258

(51) Int. Cl.
*H01L 23/00* (2006.01)
*H01L 25/065* (2006.01)
(Continued)

(52) U.S. Cl.
CPC .......... *H01L 24/05* (2013.01); *H01L 23/5286* (2013.01); *H01L 23/53295* (2013.01);
(Continued)

(58) Field of Classification Search
CPC ............... H01L 24/05; H01L 23/5286; H01L 23/53295; H01L 24/45; H01L 25/0657; H01L 2224/02331
(Continued)

(56) References Cited

FOREIGN PATENT DOCUMENTS

KR 101478247 B1 12/2014

OTHER PUBLICATIONS

Seok-Hwan Huh et al., Chlorine effect on ion migration for PCBs under temperature-humidity bias test, Journal of Welding and Joining, 2015, pp. 47-53, vol. 33 No. 3, ISSN 1225-6153, Online ISSN 2287-8955, http://dx.doi.org/10.5781/JWJ.2015.33.3.47, Busan, Republic of Korea.

(Continued)

*Primary Examiner* — Elias Ullah
(74) *Attorney, Agent, or Firm* — William Park & Associates Ltd.

(57) ABSTRACT

A semiconductor package includes: a package substrate; a first semiconductor chip disposed over the package substrate and having a center region and an edge region; and a package redistribution layer disposed over the first semiconductor chip, wherein the first semiconductor chip comprises: a lower structure; a redistribution conductive layer disposed over the lower structure and electrically connected to the lower structure, the redistribution conductive layer including a redistribution pad disposed in the center region; and a protective layer covering the lower structure and the redistribution conductive layer, and having an opening exposing the redistribution pad, wherein the package redistribution layer comprises: a package redistribution conductive layer connected to the redistribution pad and extending to the edge region, the package redistribution conductive layer including a package redistribution pad disposed in the edge region, and, wherein, in the edge region, the redistribution conductive layer is omitted.

23 Claims, 16 Drawing Sheets

(51) Int. Cl.
*H01L 23/528* (2006.01)
*H01L 23/532* (2006.01)

(52) U.S. Cl.
CPC .......... *H01L 24/45* (2013.01); *H01L 25/0657* (2013.01); *H01L 2224/02331* (2013.01)

(58) Field of Classification Search
USPC ........................................................ 257/773
See application file for complete search history.

(56) References Cited

OTHER PUBLICATIONS

Support for Test Analysis & Equipment Utilization, Reliability Test Service, Environmental Test, http://www.qrtkr.com/html/en/te_reliabilitytest_environ_1.asp, Icheon-si, Gyeonggi-do, Republic of Korea.

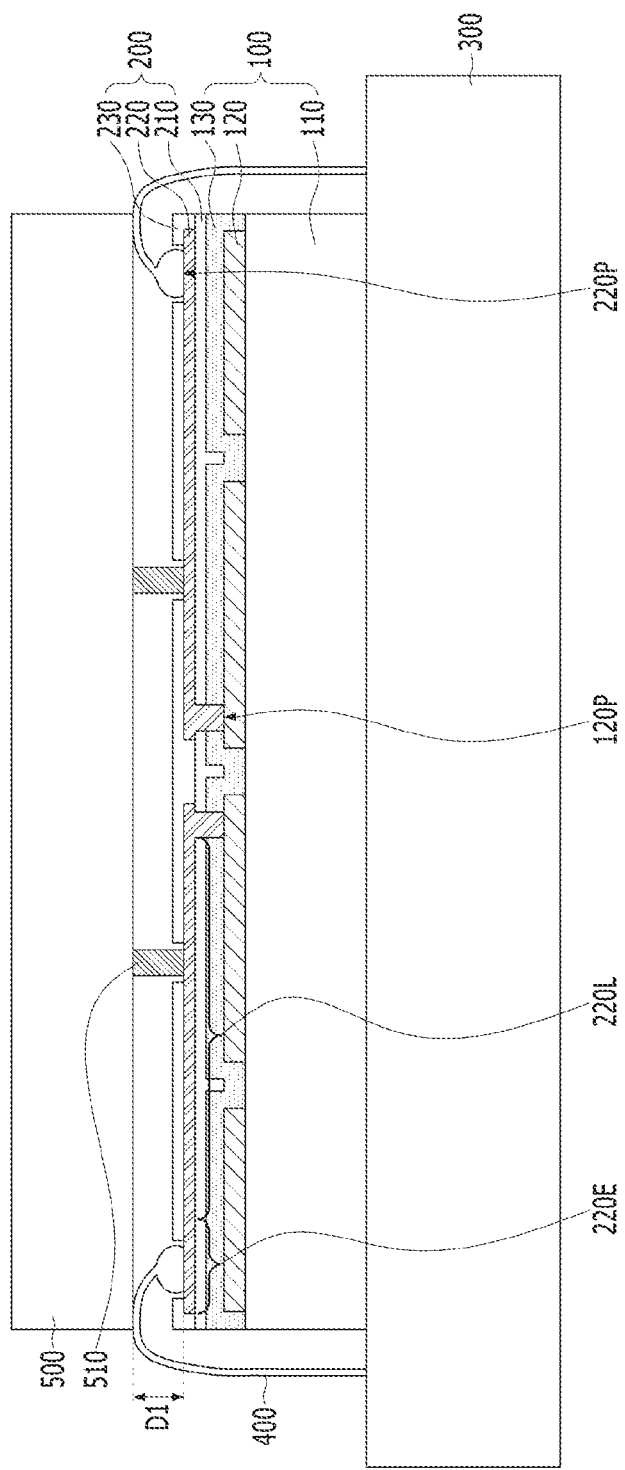

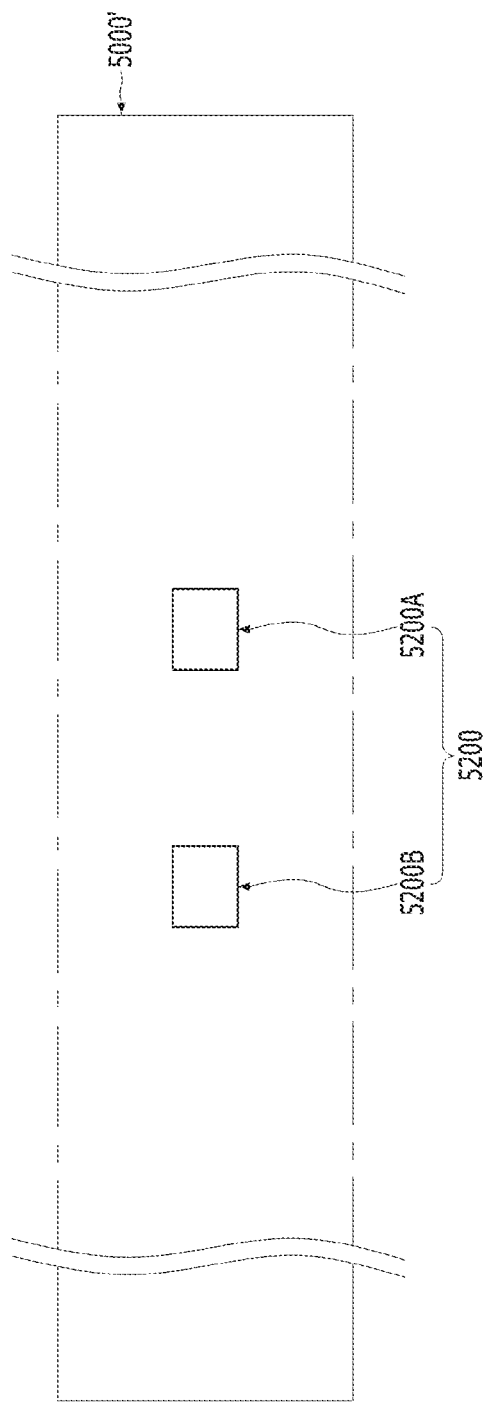

SEMICONDUCTOR PACKAGE INCLUDING A SEMICONDUCTOR CHIP HAVING A REDISTRIBUTION LAYER

CROSS-REFERENCE TO RELATED APPLICATION

This application claims priority under 35 U.S.C. § 119 to Korean Patent Application No, 10-2020-0062258 filed on May 25, 2020, which is incorporated herein by reference in its entirety.

BACKGROUND

1. Technical Field

This patent document relates to a semiconductor package, and more particularly, to a semiconductor package including a semiconductor chip having a redistribution layer.

2. Related Art

A semiconductor chip may include an integrated circuit having various functions. In order to connect this semiconductor chip to an external terminal, it may be required to form a redistribution layer.

This redistribution layer may be mainly formed in a fab-out state of a wafer in which circuit patterns are formed, that is, in a packaging process. However, in some cases, the redistribution layer may be formed together with circuit patterns in a front-end process of forming the circuit patterns in a wafer.

SUMMARY

In an embodiment, a semiconductor package may include: a package substrate; a first semiconductor chip disposed over the package substrate and having a center region and an edge region; and a package redistribution layer disposed over the first semiconductor chip, wherein the first semiconductor chip comprises: a lower structure; a redistribution conductive layer disposed over the lower structure and electrically connected to the lower structure, the redistribution conductive layer including a redistribution pad disposed in the center region; and a protective layer covering the lower structure and the redistribution conductive layer, and having an opening exposing the redistribution pad, wherein the package redistribution layer comprises: a package redistribution conductive layer connected to the redistribution pad and extending to the edge region, the package redistribution conductive layer including a package redistribution pad disposed in the edge region, and, wherein, in the edge region, the redistribution conductive layer is omitted.

BRIEF DESCRIPTION OF THE DRAWINGS

FIG. 4 is a cross-sectional view illustrating a semiconductor package in which a second semiconductor chip is stacked over the first semiconductor chip of the semiconductor package of FIG. 2A.

FIG. 8C is a plan view showing some of chip pads of a second semiconductor chip of FIG. 8A.

DETAILED DESCRIPTION

Figure 1A:
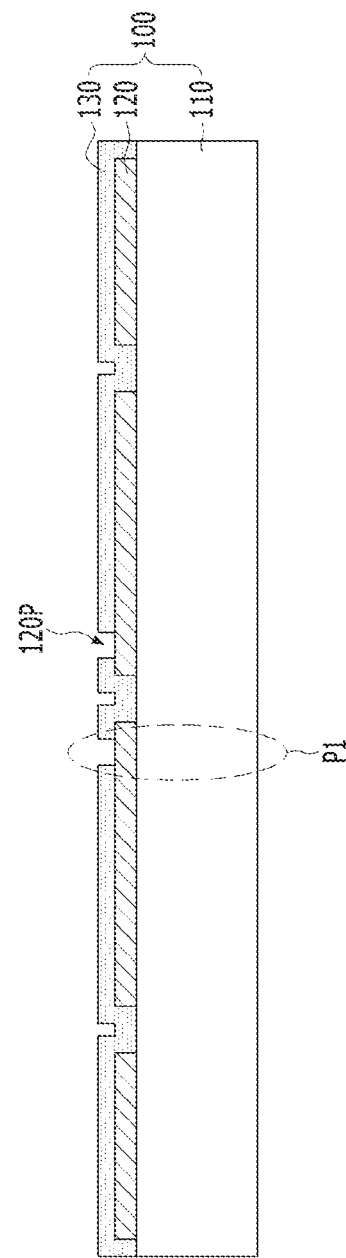
FIG. 1A is a cross-sectional view illustrating a first semiconductor chip according to an embodiment of the present disclosure.

Hereinafter, various examples of embodiments of the disclosure will be described with reference to the accompanying drawings.

The drawings might not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Hereinafter, a semiconductor chip and a semiconductor package including the same according to an embodiment of the present disclosure will be described with reference to FIGS. 1A to 4.

Figure 1B:
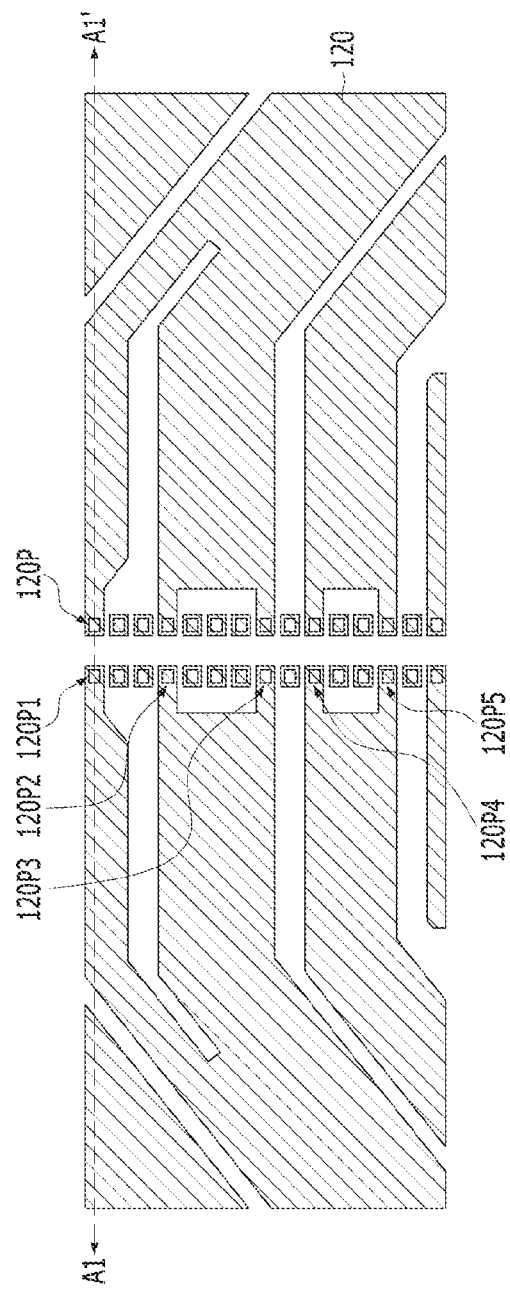
FIG. 1B is a plan view showing a portion of a redistribution conductive layer of the first semiconductor chip of FIG. 1A.
Figure 1C:
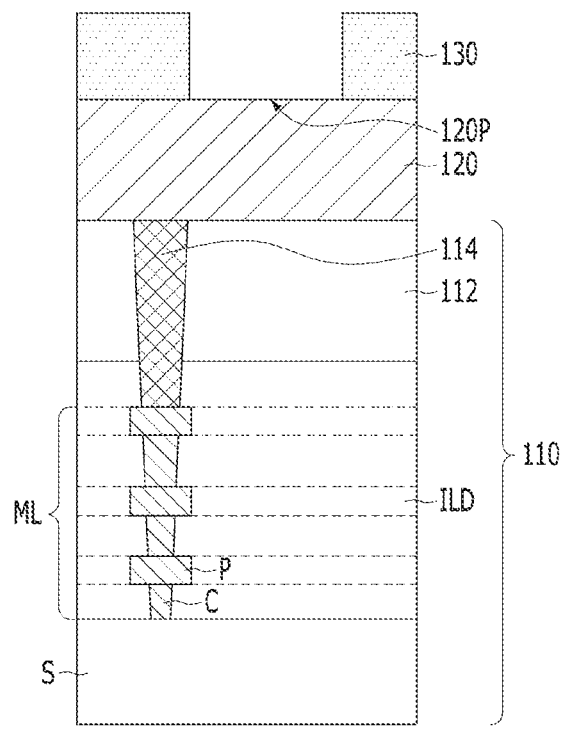
FIG. 1.0 is a cross-sectional view showing an example of a portion P1 of FIG. 1A.
Figure 2A:
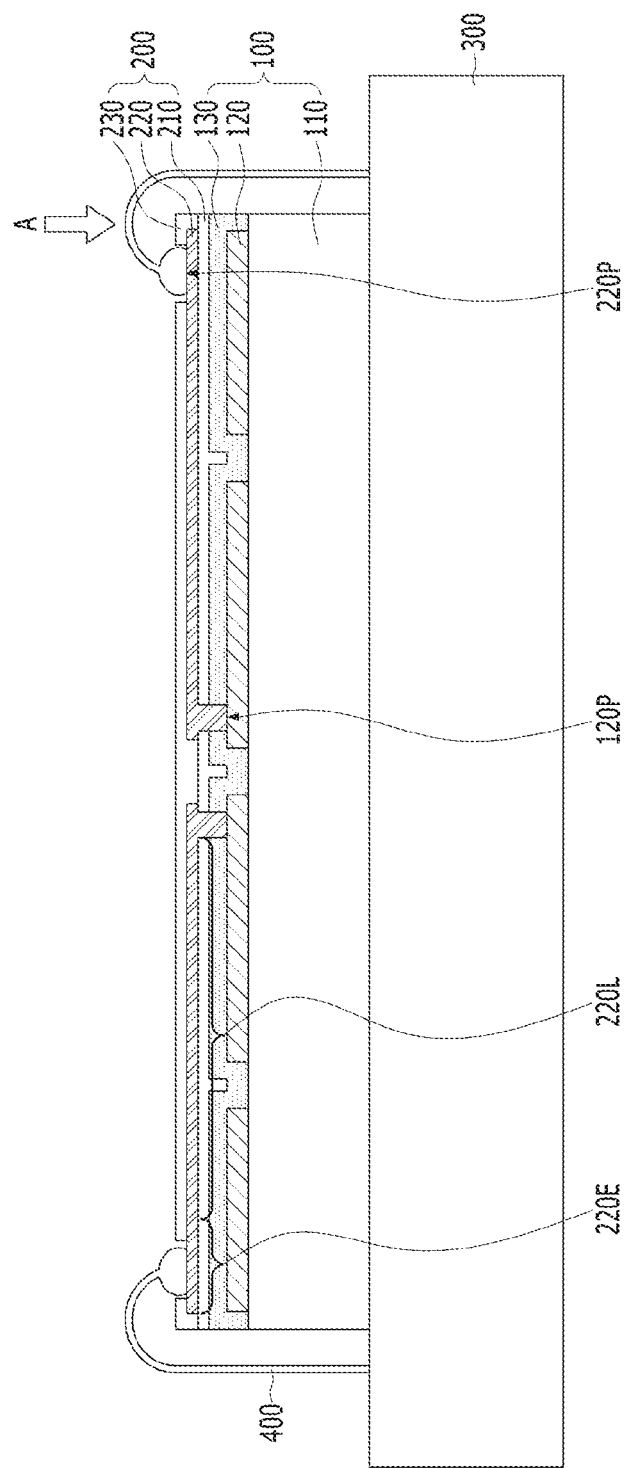
FIG. 2A is a cross-sectional view illustrating a semiconductor package including the first semiconductor chip of FIG. 1A.
Figure 2B:
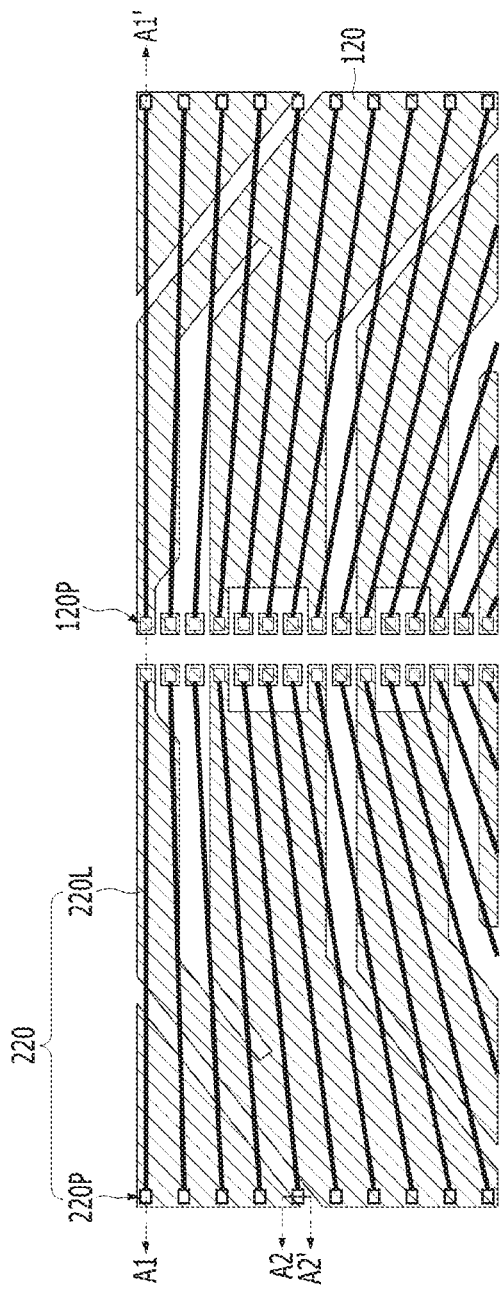
FIG. 2B is a plan view showing a portion of a redistribution conductive layer of the first semiconductor chip of FIG. 2A and a portion of a package redistribution conductive layer thereon.
Figure 3:
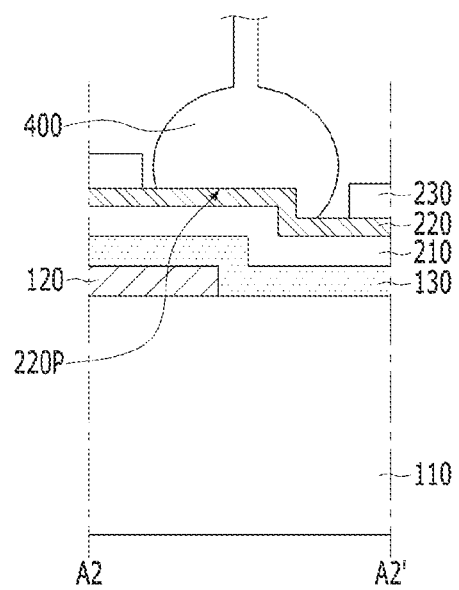
FIG. 3 is an enlarged view of a portion of a cross-section along a line A2-A2' of FIG. 2B.

FIG. 1A is a cross-sectional view illustrating a first semiconductor chip according to an embodiment of the present disclosure. FIG. 1A is illustrated based on a line A1-A1' of FIG. 1B. FIG. 1B is a plan view showing a portion of a redistribution conductive layer of the first semiconductor chip of FIG. 1A. FIG. 1C is a cross-sectional view showing an example of a portion P1 of FIG. 1A, FIG. 2A is a cross-sectional view illustrating a semiconductor package including the first semiconductor chip of FIG. 1A. FIG. 2A is illustrated based on a line A1-A1' of FIG. 2B. FIG. 2B is a plan view showing a portion of a redistribution conductive layer of the first semiconductor chip of FIG. 2A and a portion of a package redistribution conductive layer thereon. FIG. 3 is an enlarged view of a portion of a cross-section along a line A2-A2' of FIG. 2B. FIG. 4 is a cross-sectional view illustrating a semiconductor package in which a second semiconductor chip is stacked over the first semiconductor chip of the semiconductor package of FIG. 2A.

First, referring to FIGS. 1A and 1B, a first semiconductor chip 100 according to an embodiment of the present disclosure may include a lower structure 110, a redistribution conductive layer 120 formed over the lower structure 110, and a protective layer 130 covering the lower structure 110 and the redistribution conductive layer 120 while exposing a portion of the redistribution conductive layer 120. The portion of the redistribution conductive layer 120, exposed by the protective layer 130, will be referred to as a redistribution pad 120P.

Referring to FIG. 1C together with FIGS. 1A and 1B, the lower structure 110 may include a semiconductor substrate S including a semiconductor material such as silicon, a multi-layered conductive pattern ML formed on an upper surface of the semiconductor substrate S and constituting an integrated circuit, and an interlayer insulating layer ILD in which the multi-layered conductive pattern ML is embedded. The interlayer insulating layer ILD may also have a multi-layered structure (see dotted lines).

The multi-layered conductive pattern ML may include a plurality of conductors arranged in multiple layers in a direction perpendicular to the upper surface of the semiconductor substrate S and having various shapes. For example, the multi-layered conductive pattern ML may include a combination of a contact plug C and a pad P. The multi-layered conductive pattern ML may be connected to a part of the semiconductor substrate S, for example, one junction of a transistor.

Materials for forming the multi-layered conductive pattern ML and the interlayer insulating layer ILD may be appropriately selected in order to satisfy required characteristics of a semiconductor chip. As an example, at least a portion of the multi-layered conductive pattern ML may include a metal such as copper (Cu) having low resistance, and at least a portion of the interlayer insulating layer ILD may include a material having a low dielectric constant, for example, a low-k material having a dielectric constant of 2.7 or less.

However, if a semiconductor chip is covered with a protective layer and packaged by fab-out in a state in which the multi-layered conductive pattern ML and the interlayer insulating layer ILD are formed as described above, moisture may penetrate through a low-k material that is relatively vulnerable to moisture absorption. The moisture may cause electrical movement of metal ions, particularly copper ions, resulting in loss of the multi-layered conductive pattern ML or electrical shorts with other adjacent conductors. Therefore, in the first semiconductor chip 100 of the present embodiment, it may be intended to prevent the penetration of the moisture by further forming a thick insulating layer 112 over the interlayer insulating layer ILD.

The insulating layer 112 may include an insulating material having a higher dielectric constant and/or a lower moisture absorption rate than the low-k material, such as silicon oxide, silicon nitride, or a combination thereof. In addition, the insulating layer 112 may have a single-layered structure or a multi-layered structure. The insulating layer 112 may be formed relatively thick to prevent the moisture penetration. Specifically, the insulating layer 112 may be thicker than any one layer of the interlayer insulating layer ILD having a multi-layered structure. For example, the insulating layer 112 may have a thickness of tens of thousands of Å.

However, since it is necessary to connect the multi-layered conductive pattern ML to the outside, a contact plug 114 that penetrates the insulating layer 112 to connect with the multi-layered conductive pattern ML, and a redistribution conductive layer 120 that is formed over the insulating layer 112 to connect with the contact plug 114, may be further formed. For convenience of description, in the present disclosure, the insulating layer 112 and the contact plug 114 are also included in the lower structure 110.

The redistribution conductive layer 120 may include various conductive materials, for example, a metal such as aluminum (A1), and may have a single-layered structure or a multi-layered structure. In addition, the redistribution conductive layer 120 may be formed to be relatively thick for smooth signal transmission and balance with the insulating layer 112. The redistribution conductive layer 120 may have a thickness the same as or similar to the thickness of the insulating layer 112. For example, the redistribution conductive layer 120 may have a thickness of tens of thousands of Å.

The protective layer 130 may be disposed over the redistribution conductive layer 120. The protective layer 130 may function to define the redistribution pad 120P while protecting the first semiconductor chip 100. The protective layer 130 may have a single-layered structure or a multi-layered structure including various insulating materials such as an insulating polymer. In particular, the protective layer 130 may include a polyimide material such as PIQ (Polyimide Isoindro Quindzoline).

All of a process of forming the lower structure 110, a process of forming the redistribution conductive layer 120, and a process of forming the protective layer 130, may be performed before the fab-out, that is, in the front-end process. As an example, the lower structure 110 and the redistribution conductive layer 120 may be formed by repeating a process of depositing a conductive material or an insulating material, and patterning the conductive material or the insulating material by a mask and etching process. The protective layer 130 may be formed by a coating method.

Referring back to FIGS. 1A and 1B, the redistribution conductive layer 120 may be formed on the entire surface of the lower structure 110 and may have various planar shapes according to patterning. As a portion of the redistribution conductive layer 120, the redistribution pad 120P may serve as a terminal for electrically connecting the first semiconductor chip 100 with other components, TO That is, the redistribution pad 120P may serve as a chip pad of the first semiconductor chip 100. In the present embodiment, the redistribution pad 120P may be disposed at a center region of the first semiconductor chip 100. That is, the first semiconductor chip 100 may be a center pad type semiconductor chip. Also, a plurality of redistribution pads 120P may be arranged in two columns in the center region of the first semiconductor chip 100. However, the present disclosure is not limited thereto, and the arrangement of the redistribution pads 120P may be variously modified. The redistribution pads 120P may receive various signals, power, or the like.

The redistribution pads 120P to which the same power is applied among the plurality of redistribution pads 120P may be connected to each other using the redistribution conductive layer 120. This is for effective supply of power required during operations of a semiconductor chip. As an example, as illustrated in FIG. 1B, when the same power is applied to some of the redistribution pads 120P disposed in a left column, for example, a first redistribution pad 120P1, a second redistribution pad 120P2, and a third redistribution pad 120P3, the first to third redistribution pads 120P1, 120P2, and 120P3 may be connected to each other by the redistribution conductive layer 120. To this end, the redistribution conductive layer 120 may have portions overlapping the first to third redistribution pads 120P1, 120P2, and 120P3, respectively, and a portion extending from these portions to the left to merge these portions with each other. In addition, as an example, as illustrated in FIG. 1B, when the same power is applied to others of the redistribution pads 120P disposed in the left column, for example, a fourth redistribution pad 120P4 and a fifth redistribution pad 120P5. the fourth and fifth redistribution pads 120P4 and 120P5 may be connected to each other by the redistribution conductive layer 120. To this end, the redistribution conductive layer 120 may have portions overlapping the fourth and fifth redistribution pads 120P4 and 120P5, respectively, and a portion extending from these portions to the left to merge these portions with each other. When the power applied to the first to third redistribution pads 120P1, 120P2 and 120P3 is different from the power applied to the fourth and fifth redistribution pads 120P4 and 120P5, the redistribution conductive layers 120 connecting the first to third redistribution pads 120P1, 120P2, and 120P3 may be separated and spaced apart from the redistribution conductive layer 120 connecting the fourth and fifth redistribution pads 120P4 and 120P5. However, the present disclosure is not limited thereto, and the redistribution conductive layer 120 may have various shapes such as curved line shapes, plate shapes, or combinations thereof, to connect the redistribution pads 120P to which the same power is applied to each other. Even when the first semiconductor chip 100 of the present embodiment is a semiconductor memory operating at high speed, by forming a power distribution network (PDN) by connecting the redistribution pads 120P to which the same power is applied to each other, it may be possible to cope with instantaneous voltage changes. As a result, data integrity may be ensured.

The first semiconductor chip 100 may include volatile memory such as dynamic random access memory (DRAM) or static RAM (SRAM), non-volatile memory such as NAND flash, resistive RAM (RRAM), Phase-change RAM (PRAM), Magneto-resistive RAM (MRAM), or Ferroelectric RAM (FRAM), various active devices, or passive devices.

The protective layer 130 may have a step height due to a step height of a structure lying thereunder, that is, due to a step height between a region where the redistribution conductive layer 120 is present and a region where the redistribution conductive layer 120 is not present. In other words, an upper surface of a portion of the protective layer 130, which is located over the redistribution conductive layer 120, may be higher than an upper surface of another portion of the protective layer 130, which is located over the lower structure 110. As described above, since the thickness of the redistribution conductive layer 120 is quite large, the step height of the protective layer 130 may also be quite large.

Meanwhile, when another semiconductor chip is stacked over the first semiconductor chip 100, for example, when a double die package (DDP) product is implemented, it may be required to redistribute the redistribution pad 120P, which is disposed in the center region of the first semiconductor chip 100, to an edge region of the first semiconductor chip 100. In the present embodiment, the redistribution of the redistribution pad 120P may be performed in a fab-out state of the first semiconductor chip 100, that is, in a packaging process. If the redistribution of the redistribution pad 120P is performed before the fab-out using a process the same as/similar to the process of forming the redistribution conductive layer 120, parasitic capacitance due to overlapping of a redistribution layer from the redistribution pad 120P and the redistribution conductive layer 120 may be excessively increased. In order to distinguish a redistribution layer formed in the fab-out state from the redistribution conductive layer 120 formed before the fab-out, the redistribution layer formed in the fab-out state will be referred to as a package redistribution layer. FIGS. 2A and 2B to be described below shows a state in which a package redistribution layer 200 is formed over the redistribution conductive layer 120 of the first semiconductor chip 100. In addition, FIG. 2A shows a semiconductor package in which the package redistribution layer 200 and a package substrate 300 are connected by a bonding wire 400.

Referring to FIGS. 2A and 2B, the package redistribution layer 200 may be formed over the first semiconductor chip 100.

The package redistribution layer 200 may include a first package redistribution insulating layer 210, a package redistribution conductive layer 220, and a second package redistribution insulating layer 230. For reference, only the package redistribution conductive layer 220 of the package redistribution layer 200 is illustrated in the plan view of FIG. 2B.

The first package redistribution insulating layer 210 may cover the protective layer 130 which is located at the uppermost portion of the first semiconductor chip 100, while having an opening overlapping the opening of the protective layer 130. Accordingly, an upper surface of the redistribution pad 120P may be exposed through the opening of the first package redistribution insulating layer 210 and the opening of the protective layer 130. In the cross-sectional view of FIG. 2A, sizes of the opening of the first package redistribution insulating layer 210 and the opening of the protective layer 130 are the same, and the opening of the first package redistribution insulating layer 210 and the opening of the protective layer 130 completely overlap with each other, but the present disclosure is not limited thereto. In another embodiment, the sizes of the opening of the first package redistribution insulating layer 210 and the opening of the protective layer 130 may be different from each other. Alternatively, in another embodiment, the opening of the first package redistribution insulating layer 210 and the opening of the protective layer 130 may partially overlap with each other.

The first package redistribution insulating layer 210 may include various insulating materials. For example, the first package redistribution insulating layer 210 may include silicon oxide, silicon nitride, or a combination thereof. Alternatively, the first package redistribution insulating layer 210 may include a resin material such as epoxy, polyimide, PBO (Polybenzoxazole), BCB (Benzocyclobuten), silicone, or acrylate. The first package redistribution insulating layer 210 may be formed of an insulating material different from the protective layer 130. In addition, the first package redistribution insulating layer 210 may have a smaller thickness than the protective layer 130.

The package redistribution conductive layer 220 may be connected to the redistribution pad 120P through the opening of the first package redistribution insulating layer 210 and the opening of the protective layer 130. The package redistribution conductive layer 220 may be disposed over the first package redistribution insulating layer 210, and may extend to the edge region of the first semiconductor chip 100. The package redistribution conductive layer 220 may extend from the redistribution pad 120P, and may include a line portion 220L and an end portion 220E. The line portion 220L may have a relatively small width. The end portion 220E may be located at an end of the line portion 220L, and may have a plate shape having a relatively large width. At least a part of the end portion 220E of the package redistribution conductive layer 220 may be exposed by an opening of the second package redistribution insulating layer 230. The exposed part of the end portion 220E will be referred to as a package redistribution pad 220P.

The package redistribution pad 220P may overlap each of both edge regions of the first semiconductor chip 100. As an example, the package redistribution pads 220P, which are connected to the redistribution pads 120P disposed in the left column in the center region of the first semiconductor chip 100, may be arranged in a column at a left edge region of the first semiconductor chip 100. Also, the package redistribution pads 220P, which are connected to the redistribution pads 120P disposed in the right column in the center region of the first semiconductor chip 100, may be arranged in a column at a right edge region of the first semiconductor chip 100. However, the present disclosure is not limited thereto, and as long as the redistribution pads 120P in the center region of the first semiconductor chip 100 extend to the edge region of the first semiconductor chip 100, the arrangement of the package redistribution pads 220P may be variously modified.

The package redistribution conductive layer 220 may include various conductive materials. For example, the package redistribution conductive layer 220 may include metal materials such as copper or gold. The package redistribution conductive layer 220 may be formed of a different conductive material from the redistribution conductive layer 120. In addition, the package redistribution conductive layer 220 may have a smaller thickness than the redistribution conductive layer 120.

The second package redistribution insulating layer 230 may cover the first package redistribution insulating layer 210 and the package redistribution conductive layer 220, and may have an opening exposing a portion of the package redistribution conductive layer 220. In particular, referring to FIG. 2A, the portion of the package redistribution conductive layer 220, which is exposed by the opening of the second package redistribution insulating layer 230, may form the package redistribution pad 220P, as described above.

The second package redistribution insulating layer 230 may include various insulating materials. For example, the second package redistribution insulating layer 230 may include silicon oxide, silicon nitride, or a combination thereof. Alternatively, the second package redistribution insulating layer 230 may include a resin material such as epoxy, polyimide, PBO (Polybenzoxazole), BCB (Benzocyclobuten), silicone, or acrylate. The second package redistribution insulating layer 230 may be formed of an insulating material different from the protective layer 130, and may be formed of the same insulating material as the first package redistribution insulating layer 210. In addition, the second package redistribution insulating layer 230 may have a smaller thickness than the protective layer 130.

When the package redistribution layer 200 described above is formed over the first semiconductor chip 100, the first semiconductor chip 100 may be electrically connected to other components through the package redistribution layer 200. As an example, other components may be a package substrate 300, another semiconductor chip to be disposed over the first semiconductor chip 100 (see 500 of FIG. 4), or the like.

The first semiconductor chip 100 may be mounted over the package substrate 300 such that the package redistribution pad 220P faces upward with respect to the package substrate 300. That is, the first semiconductor chip 100 may be formed over the package substrate 300 in a face-up type. A lower surface of the first semiconductor chip 100 may be attached to an upper surface of the package substrate 300 directly or through an adhesive material (not shown).

The package substrate 300 may be a substrate for a semiconductor package having a circuit and/or wiring structure (not shown) for electric signal transmission. For example, the package substrate 300 may be a printed circuit board (PCB).

The first semiconductor chip 100 and the package substrate 300 may be electrically connected through the bonding wire 400. One end of the bonding wire 400 may be welded to the package redistribution pad 220P, and the other end of the bonding wire 400 may be welded to a part of the upper surface of the package substrate 300, for example, a bonding finger (not shown), by ultrasonic energy and/or heat.

The first semiconductor chip 100 and the semiconductor package including the same, which are described above, may have following advantages.

First, since a relatively thick insulating layer 112 is formed over the multi-layered conductive pattern ML and the interlayer insulating layer ILD, even when the multi-layered conductive pattern ML and the interlayer insulating layer ILD include a low-k material vulnerable to moisture, and a metal such as copper, which is ionized by the moisture and easily moves, it may be possible to prevent penetration of the moisture into the first semiconductor chip 100. As a result, reliability of the first semiconductor chip 100 may be secured.

In addition, it may be possible to enable effective power supply by connecting the redistribution pads 120P to which the same power is applied to each other using the redistribution conductive layer 120. As a result, operating characteristics of the first semiconductor chip 100 may be improved.

In addition, when the redistribution pad 120P is located in the center region of the first semiconductor chip 100, the redistribution pad 120P may be redistributed to the edge region of the first semiconductor chip 100 through the package redistribution layer 200. In this case, it may be possible to implement a chip stacked product without significantly increasing capacitance.

Meanwhile, in the semiconductor package of FIG. 2A, although not shown, the package redistribution layer 200 may also be formed along a step height of a lower structure lying thereunder, that is, the step height of the protective layer 130. In general, the step heights might not cause a problem. However, if a step height exists in the package redistribution pad 220P, a problem may occur in the process of forming the bonding wire 400. This will be described by way of example with reference to FIG. 3 together with FIG. 2B.

Referring to FIGS. 2B and 3, in the part indicated by the line A2-A2', a portion of the package redistribution pad 220P may overlap the redistribution conductive layer 120, while the other portion of the package redistribution pad 220P may overlap the lower structure 110. Since the protective layer 130, the first package redistribution insulating layer 210, and the package redistribution conductive layer 220 are formed along a step height of a structure lying thereunder, a step height may also occur in the package redistribution pad 220P.

When the one end of the bonding wire 400 is welded on the package redistribution pad 220P having the step height, the process of forming the bonding wire 400 may be difficult and bonding defects may occur.

In addition, in the semiconductor package of FIG. 2A, another semiconductor chip may be stacked over the first semiconductor chip 100 to implement a chip stacked product. However, in some cases, for example, in a case that another semiconductor chip is disposed to have a small distance from the first semiconductor chip 100 while covering the edge region of the first semiconductor chip 100, a space for forming an apex of a curved portion of the bonding wire 400 may be insufficient. In an embodiment, an apex of the curved portion of the bonding wire may be a portion of the bonding wire that is at a summit, peak, tip, top, or extreme end of the curved part of the bonding wire 400 (see A). This will be described by way of example with reference to FIG. 4.

Referring to FIG. 4, a second semiconductor chip 500 may be disposed over the semiconductor package of FIG. 2A.

The second semiconductor chip 500 may be the same semiconductor chip as the first semiconductor chip 100 or a different semiconductor chip, and may be disposed to overlap at least a portion of the first semiconductor chip 100. Also, the second semiconductor chip 500 may be electrically connected to the first semiconductor chip 100 and/or the package substrate 300 through various interconnectors.

As an example, in the cross-sectional view of FIG. 4, the second semiconductor chip 500 may have the same length as the first semiconductor chip 100, and both edges of the second semiconductor chip 500 may be aligned with both edges of the first semiconductor chip 100. Accordingly, the both edge regions of the first semiconductor chip 100 may overlap the second semiconductor chip 500. Furthermore, as an example, the second semiconductor chip 500 may be formed over the first semiconductor chip 100 in a face-down type in which an active surface on which a chip pad (not shown) is disposed faces downward. The second semiconductor chip 500 may be connected to the package redistribution conductive layer 220 through a bump 510 connected to the chip pad (not shown), and thus, electrically connected to the first semiconductor chip 100. In order to connect the bump 510 of the second semiconductor chip 500 to the package redistribution conductive layer 220, the second package redistribution insulating layer 230 may have an opening to expose a portion of the package redistribution conductive layer 220. The bump 510 may be connected to the package redistribution conductive layer 220 through this opening. Although not illustrated, in order to facilitate the connection between the bump 510 and the package redistribution conductive layer 220, the portion of the package redistribution conductive layer 220, which is connected to the bump 510, may have a plate shape having a larger width than the line portion 220L. For example, the portion of the package redistribution conductive layer 220 connected to the bump 510 may have a planar shape the same as or similar to a planar shape of the end portion 220E.

In the present embodiment, a space in which the apex of the curved portion of the bonding wire 400 is formed may depend on a distance between the first semiconductor chip 100 and the second semiconductor chip 500, in particular, a distance D1 between the package redistribution pad 220P and a lower surface of the second semiconductor chip 500. However, it may be difficult to arbitrarily increase the distance between the first semiconductor chip 100 and the second semiconductor chip 500 due to the size limitation of the bump 510. For this reason, the space in which the apex of the curved portion of the bonding wire 400 is formed may be insufficient, and thus, a part of the bonding wire 400 may contact the second semiconductor chip 500. In this case, due to pressure applied when the second semiconductor chip 500 is stacked, process defects may occur. For example, the bonding wire 400 may be deformed to contact another bonding wire, thereby causing an electrical short therebetween. Alternatively, for example, a neck portion of a ball of the bonding wire 400 may be broken.

Hereinafter, an embodiment capable of solving the problems that may occur in the above-described embodiment will be further proposed. A semiconductor chip and a semiconductor package including the same according to another embodiment of the present disclosure will be described with reference to FIGS. 5A to 7.

Figure 5A:
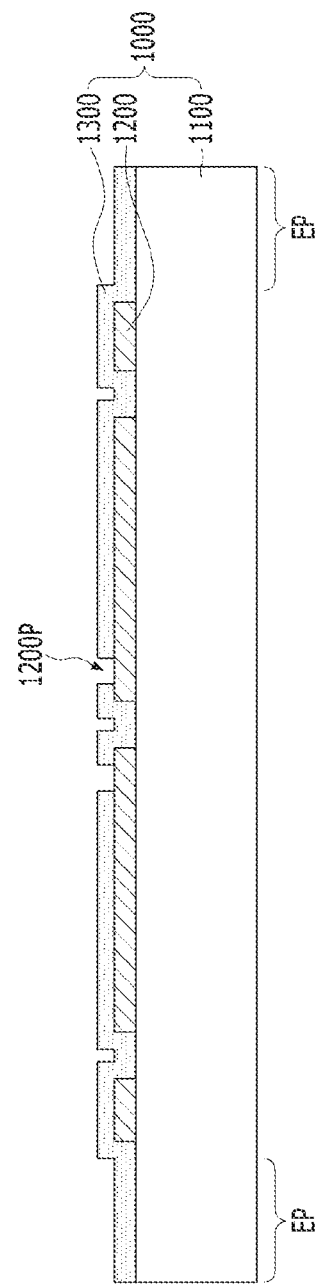
FIG. 5A is a cross-sectional view illustrating a first semiconductor chip according to another embodiment of the present disclosure.
Figure 5B:
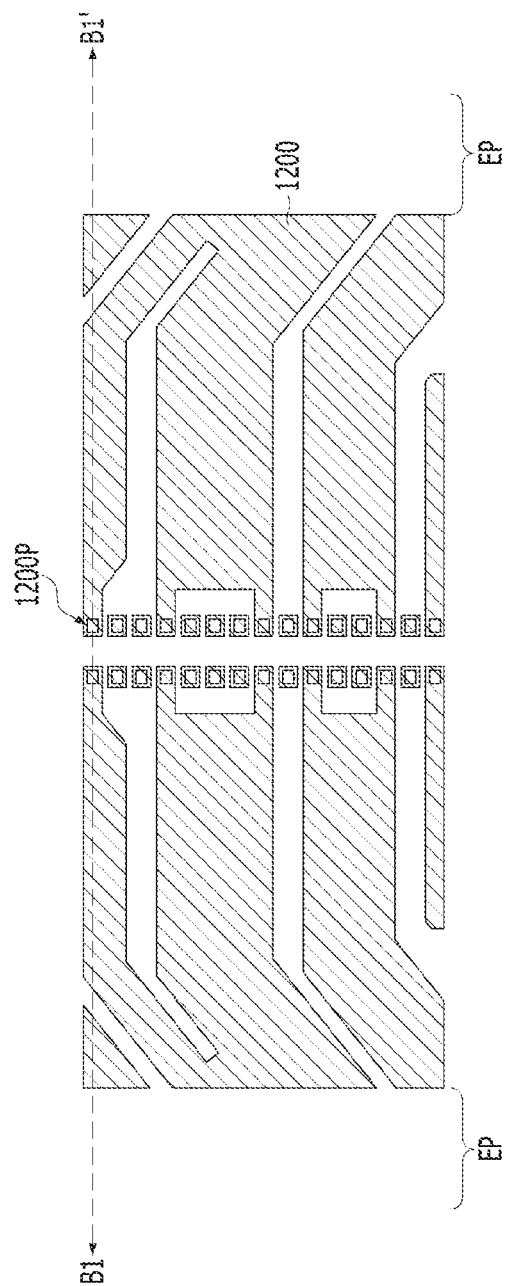
FIG. 5B is a plan view showing a portion of the redistribution conductive layer of the first semiconductor chip of FIG. 5A.
Figure 6A:
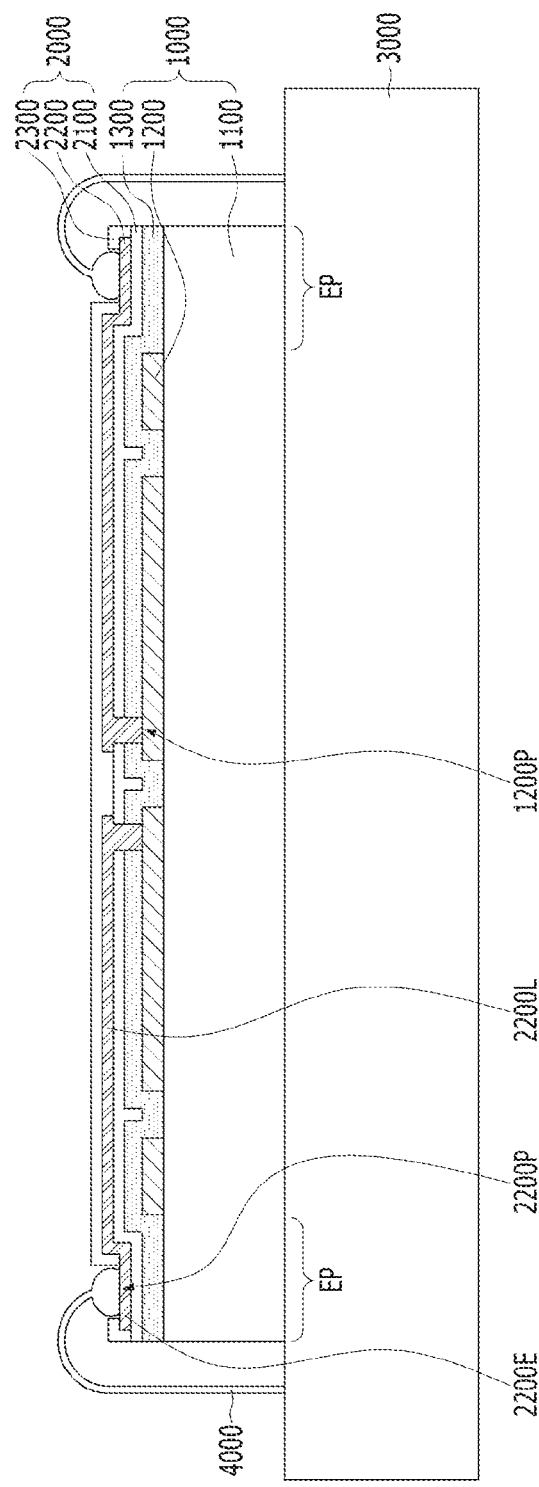
FIG. 6A is a cross-sectional view illustrating a semiconductor package including the first semiconductor chip of FIG. 5A.
Figure 6B:
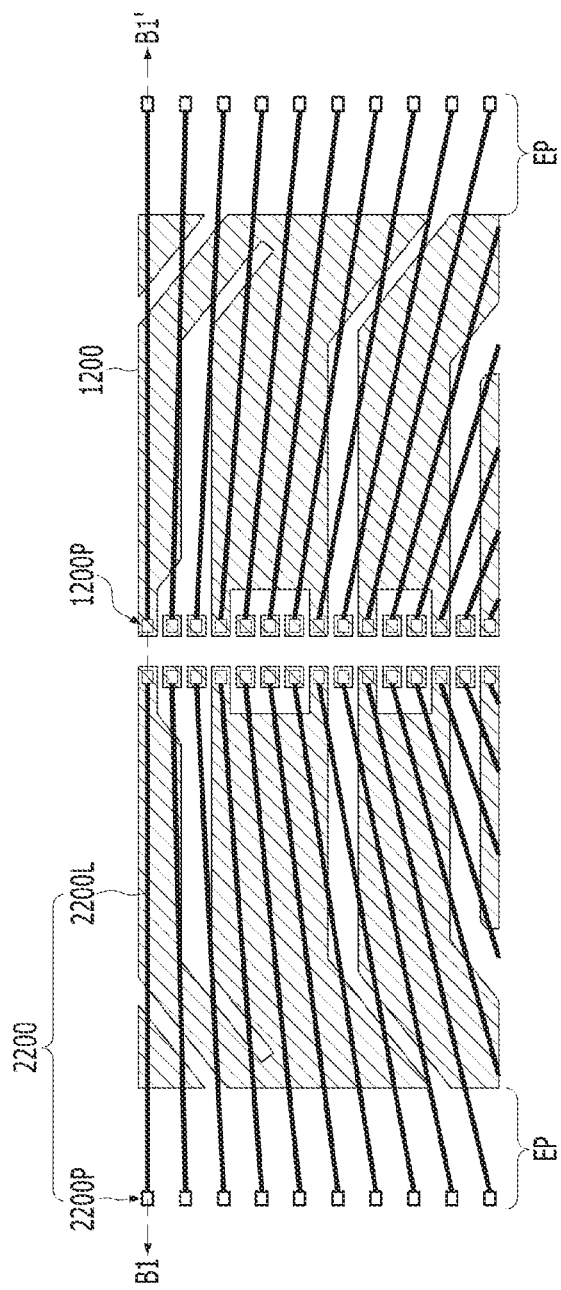
FIG. 6B is a plan view showing a portion of a redistribution conductive layer of the first semiconductor chip of FIG. 6A and a portion of the package redistribution conductive layer thereon.
Figure 7:
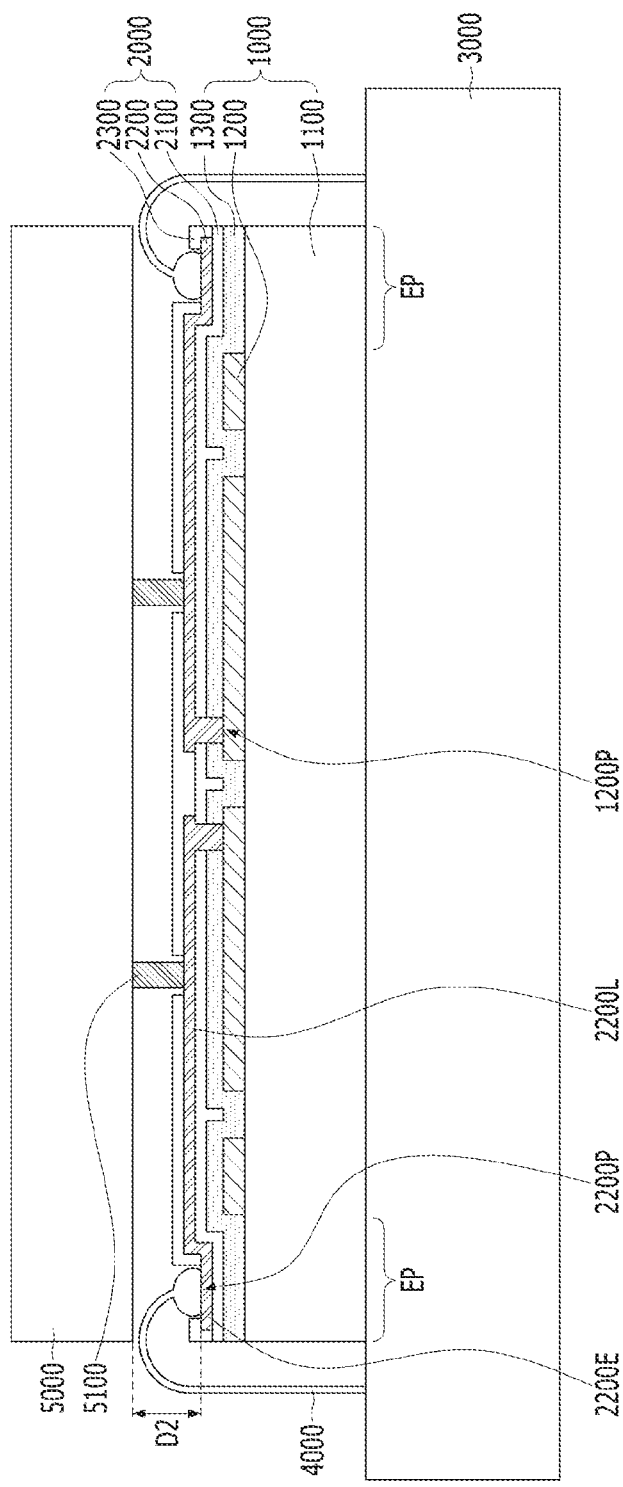
FIG. 7 is a cross-sectional view illustrating a semiconductor package in which a second semiconductor chip is stacked over the first semiconductor chip of the semiconductor package of FIG. 6A.

FIG. 5A is a cross-sectional view illustrating a first semiconductor chip according to another embodiment of the present disclosure. FIG. 5A is illustrated based on a line B1-B1' of FIG. 5B. FIG. 5B is a plan view showing a portion of the redistribution conductive layer of the first semiconductor chip of FIG. 5A. FIG. 6A is a cross-sectional view illustrating a semiconductor package including the first semiconductor chip of FIG. 5A. FIG. 6A is illustrated based on a line B1-B1' of FIG. 6B. FIG. 6B is a plan view showing a portion of a redistribution conductive layer of the first semiconductor chip of FIG. 6A and a portion of the package redistribution conductive layer thereon. FIG. 7 is a cross-sectional view illustrating a semiconductor package in which a second semiconductor chip is stacked over the first semiconductor chip of the semiconductor package of FIG. 6A. For the parts substantially the same as the above-described embodiment, detailed description thereof will be omitted.

First, referring to FIGS. 5A and 5B, a first semiconductor chip 1000 according to another embodiment of the present disclosure may include a lower structure 1100, a redistribution conductive layer 1200 formed over the lower structure 1100, and a protective layer 1300 covering the lower structure 1100 and the redistribution conductive layer 1200 while exposing a portion of the redistribution conductive layer 1200. The portion of the redistribution conductive layer 1200, which is exposed by the protective layer 1300, will be referred to as a redistribution pad 1200P.

The lower structure 1100 may be substantially the same as the lower structure (see FIG. 1C) of the above-described embodiment. That is, the lower structure 1100 may include a multi-layered conductive pattern, an interlayer insulating layer in which the multi-layered conductive pattern is embedded, and a thick insulating layer formed thereon.

The redistribution conductive layer 1200 may include various conductive materials, for example, a metal such as aluminum (A1), and may have a single-layered structure or a multi-layered structure. In addition, the redistribution conductive layer 1200 may be formed to be relatively thick for smooth signal transmission and balance with an insulating layer (not shown) formed thickly under the redistribution conductive layer 1200. For example, the redistribution conductive layer 1200 may have a thickness of tens of thousands of A.

As a portion of the redistribution conductive layer 1200, the redistribution pad 1200P may serve as a terminal for electrically connecting the first semiconductor chip 1000 with other components, that is, as a chip pad of the first semiconductor chip 1000. In the present embodiment, the redistribution pad 1200P may be disposed at a center region of the first semiconductor chip 1000. That is, the first semiconductor chip 1000 may be a center pad type semiconductor chip. Also, a plurality of redistribution pads 1200P may be arranged in two columns in the center region of the first semiconductor chip 1000. However, the present disclosure is not limited thereto, and the arrangement of the redistribution pads 1200P may be variously modified. The redistribution pads 1200P may receive various signals and power.

The redistribution conductive layer 1200 may be formed over an entire surface of the lower structure 1100, and may have various planar shapes according to patterning. At this time, apart from the above-described embodiment, the redistribution conductive layer 1200 might not extend to edge regions EP at both sides of the semiconductor chip 1000. That is, the redistribution conductive layer 1200 may be omitted in the edge regions EP at the both sides of the semiconductor chip 1000. The edge region EP may be a region where a package redistribution pad, which will be described later, is disposed. Except for this, as in the above-described embodiment, the redistribution conductive layer 1200 may be patterned to connect the redistribution pads 1200P to which the same power is applied to each other. Accordingly, power required in operations of the first semiconductor chip 1000 may be effectively supplied.

A protective layer 1300 may be disposed over the redistribution conductive layer 1200. The protective layer 1300 may function to define the redistribution pad 1200P while protecting the first semiconductor chip 1000. The protective layer 1300 may have a single-layered structure or a multi-layered structure including various insulating materials such as an insulating polymer. In particular, the protective layer 1300 may include a polyimide material such as PION.

The protective layer 1300 may be formed along a step height of a structure lying thereunder. That is, the protective layer 1300 may be formed reflecting a profile of an upper surface of the structure lying thereunder. Accordingly, a height of an upper surface of a portion of the protective layer 1300, which is located over the redistribution conductive layer 1200, may be higher than a height of an upper surface of another portion of the protective layer 1300, which is located over the lower structure 1100. Since the redistribution conductive layer 1200 is removed in the edge region EP of the first semiconductor chip 1000, a height of an upper surface of the protective layer 1300 in the edge region EP may be low.

When another semiconductor chip is stacked over the first semiconductor chip 1000, for example, when a DDP product is implemented, it may be required to redistribute the redistribution pad 1200P, which is disposed in the center region of the first semiconductor chip 1000, to the edge region EP of the first semiconductor chip 1000. The redistribution of the redistribution pad 1200P will be described with reference to FIGS. 6A and 6B below. FIGS. 6A and 6B show a state in which a package redistribution layer 2000 is formed over the first semiconductor chip 1000. In addition, FIG. 6A shows a semiconductor package in which the package redistribution layer 2000 and the package substrate 3000 are connected by a bonding wire 4000.

Referring to FIGS. 6A and 6B, the package redistribution layer 2000 may be formed over the first semiconductor chip 1000.

The package redistribution layer 2000 may include a first package redistribution insulating layer 2100, a package redistribution conductive layer 2200, and a second package redistribution insulating layer 2300. For reference, only the package redistribution conductive layer 2200 of the package redistribution layer 2000 is illustrated in the plan view of FIG. 6B.

The first package redistribution insulating layer 2100 may cover the protective layer 1300 located at the uppermost portion of the first semiconductor chip 1000 while having an opening overlapping the opening of the protective layer 1300. Accordingly, the upper surface of the redistribution pad 1200P may be exposed through the opening of the first package redistribution insulating layer 2100 and the opening of the protective layer 1300. The first package redistribution insulating layer 2100 may be formed along the step height of the protective layer 1300. Accordingly, a height of a portion of an upper surface of the first package redistribution insulating layer 2100 at the edge region EP may be lower than a height of an upper surface of another portion of the first package redistribution insulating layer 2100 at a region where the redistribution conductive layer 1200 is formed under the protective layer 1300. In addition, the height of the portion of the upper surface of the first package redistribution insulating layer 2100 at the edge region EP may be lower than the height of the upper surface of the first package redistribution insulating layer 210 of the above-described embodiment.

The package redistribution conductive layer 2200 may be connected to the redistribution pad 1200P through the opening of the first package redistribution insulating layer 2100 and the opening of the protective layer 1300, and may extend to the edge region EP of the first semiconductor chip 1000 over the first package redistribution insulating layer 2100. The package redistribution conductive layer 2200 may be formed along a step height of the first package redistribution insulating layer 2100 and/or the protective layer 1300. That is, the package redistribution conductive layer 220 may be formed reflecting a profile of an upper surface of a structure lying thereunder, for example, a profile of the upper surface of the first package redistribution insulating layer 2100 and/or a profile of the upper surface of the protective layer 1300. Accordingly, a height of an upper surface of a portion of the package redistribution conductive layer 2200 at the edge region EP may be lower than a height of an upper surface of another portion of the package redistribution conductive layer 2200 at a region where the redistribution conductive layer 1200 is formed under the protective layer 1300. In addition, the height of the upper surface of the portion of the package redistribution conductive layer 2200 at the edge region EP may be lower than the height of the upper surface of the package redistribution conductive layer 220 of the above-described embodiment.

The package redistribution conductive layer 2200 may include a line portion 2200L and an end portion 2200E. The line portion 2200L may extend from the redistribution pad 1200P, and may have a relatively small width. The end portion 2200E may be located at an end of the line portion 2200L, and may have a plate shape having a relatively large width. At least a part of the end portion 2200E of the package redistribution conductive layer 2200 may be exposed by an opening of the second package redistribution insulating layer 2300. The exposed part of the end portion 2200E will be referred to as a package redistribution pad 2200P.

The package redistribution pad 2200P may overlap the edge regions EP at both sides of the first semiconductor chip 1000. For this reason, a height of an upper surface of the package redistribution pad 2200P may also be relatively low. In addition, since the redistribution conductive layer 1200 does not exist under the package redistribution pad 2200P, a step height does not occur in the package redistribution pad 2200P. That is, the package redistribution pad 2200P may have a flat surface.

The second package redistribution insulating layer 2300 may cover the first package redistribution insulating layer 2100 and the package redistribution conductive layer 2200, while having an opening exposing a portion of the package redistribution conductive layer 2200. In particular, referring to FIG. 6A, the portion of the package redistribution conductive layer 2200 exposed by the opening of the second package redistribution insulating layer 2300 may form the package redistribution pad 2200P as described above. The second package redistribution insulating layer 2300 may also be formed along a step height of a structure lying thereunder. In an embodiment, the second package redistribution insulating layer 2300 may be in contact with an upper surface of the package redistribution conductive layer 2200 and side surfaces of the package redistribution conductive layer 2200 as shown in FIG. 6A. In an embodiment, second package redistribution insulating layer 2300 may cover the first package redistribution insulating layer 2100 and the package redistribution conductive layer 2200, while having an opening exposing an upper surface of a portion of the package redistribution conductive layer 2200.

When the package redistribution layer 2000 described above is formed over the first semiconductor chip 1000, the first semiconductor chip 1000 may be electrically connected to other components through the package redistribution layer 2000.

The first semiconductor chip 1000 may be mounted over the package substrate 3000 such that the package redistribution pad 2200P faces upward with respect to the package substrate 3000. That is, the first semiconductor chip 1000 may be formed over the package substrate 3000 in a face-up type.

The first semiconductor chip 1000 and the package substrate 3000 may be electrically connected through the bonding wire 4000. One end of the bonding wire 4000 may be welded to the package redistribution pad 2200P, and the other end of the bonding wire 4000 may be to be welded to a portion of the upper surface of the package substrate 3000, for example, a bonding finger.

The semiconductor chip and the semiconductor package including the same, according to the present embodiment, may have all the advantages of the above-described embodiment.

In addition, since the bonding wire 4000 is bonded to the package redistribution pad 2200P having a flat surface, defects in the bonding process may be prevented.

Furthermore, since the redistribution conductive layer 1200 is omitted in the edge region EP of the first semiconductor chip 1000, a total thickness of the layers 1300, 2100, 2200, and 2300, formed in the edge region EP of the first semiconductor chip 1000, may be reduced. In particular, since the height of the upper surface of the package redistribution pad 2200P decreases, even if another semiconductor chip overlapping the first semiconductor chip 1000 is stacked over the first semiconductor chip 1000, a space for forming an apex of a curved portion of the bonding wire 4000 may be sufficiently secured. This will be described, for example, with reference to FIG. 7.

Referring to FIG. 7, a second semiconductor chip 5000 may be formed over the first semiconductor chip 1000 on which the package redistribution layer 2000 is formed.

The second semiconductor chip 5000 may be the same semiconductor chip as the first semiconductor chip 1000 or a different semiconductor chip, and may be disposed to overlap at least a portion of the first semiconductor chip 1000. Also, the second semiconductor chip 5000 may be electrically connected to the first semiconductor chip 1000 and/or the package substrate 3000 through various interconnectors.

As an example, in the cross-sectional view of FIG. 7, the second semiconductor chip 5000 may have the same length as the first semiconductor chip 1000, and both edges of the second semiconductor chip 5000 may be aligned with both edges of the first semiconductor chip 1000. Further, as an example, the second semiconductor chip 5000 may be formed over the first semiconductor chip 1000 in a face-down type in which an active surface on which a chip pad is disposed faces downward. The second semiconductor chip 5000 may be connected to the package redistribution conductive layer 2220 through a bump 5100 connected to a chip pad (not shown), and thus electrically connected to the first semiconductor chip 1000. The second package redistribution insulating layer 2300 may have an opening which exposes a portion of the package redistribution conductive layer 2200 so that the bump 5100 of the second semiconductor chip 5000 is connected to the package redistribution conductive layer 2200. The bump 5100 may be connected to the package redistribution conductive layer 2200 through this opening. Although not illustrated, in order to facilitate the connection of the bump 5100 and the package redistribution conductive layer 2200, a portion of the package redistribution conductive layer 2200, which is connected to the package redistribution conductive layer 2200, may have a plate shape having a larger width than the line portion 2200L.

In the present embodiment, the space in which the apex of the curved portion of the bonding wire 4000 is to be formed may be determined according to a distance D2 between the upper surface of the package redistribution pad 2200P and the lower surface of the second semiconductor chip 5000. Compared to the above-described embodiment, a distance between the first semiconductor chip 1000 and the second semiconductor chip 5000, that is, a height of the bump 5100 may be constant, while the height of the upper surface of the package redistribution pad 2200P may be reduced. Therefore, the distance D2 between the upper surface of the package redistribution pad 2200P and the lower surface of the second semiconductor chip 5000 may be increased compared to the distance D1 in the above-described embodiment. Therefore, the space in which the apex of the curved portion of the bonding wire 4000 is to be formed may be increased. Accordingly, a peak of the curved portion of the bonding wire 4000 may be spaced apart from the second semiconductor chip 5000.

Meanwhile, in the embodiment of FIGS. 5A to 7, the first semiconductor chip 1000 and the second semiconductor chip 5000 may be semiconductor chips of the same type. In this case the arrangement of the chip pads of the first semiconductor chip 1000 and the second semiconductor chip 5000 may be the same. However, in the first semiconductor chip 1000, the active surface on which the redistribution pads 1200P are disposed faces upward, while the second semiconductor chip 5000 is stacked over the first semiconductor chip 1000 in a state in which the active surface on which the chip pads are disposed faces downward. For this reason, positions of the chip pads of the first semiconductor chip 1000 and positions of the chip pads of the second semiconductor chip 5000 may be reversed. In this case, when the first semiconductor chip 1000 and the second semiconductor chip 5000 are completely overlapped, the chip pads of the first semiconductor chip 1000 might not be connected to the corresponding chip pads of the second semiconductor chip 5000. To solve this problem, the second semiconductor chip 5000 may be shifted a predetermined distance in a horizontal direction, and a layout of the package redistribution layer 2000 of the first semiconductor chip 1000 may be modified. This will be described below with reference to FIGS. 8A to 8C below.

Figure 8A:
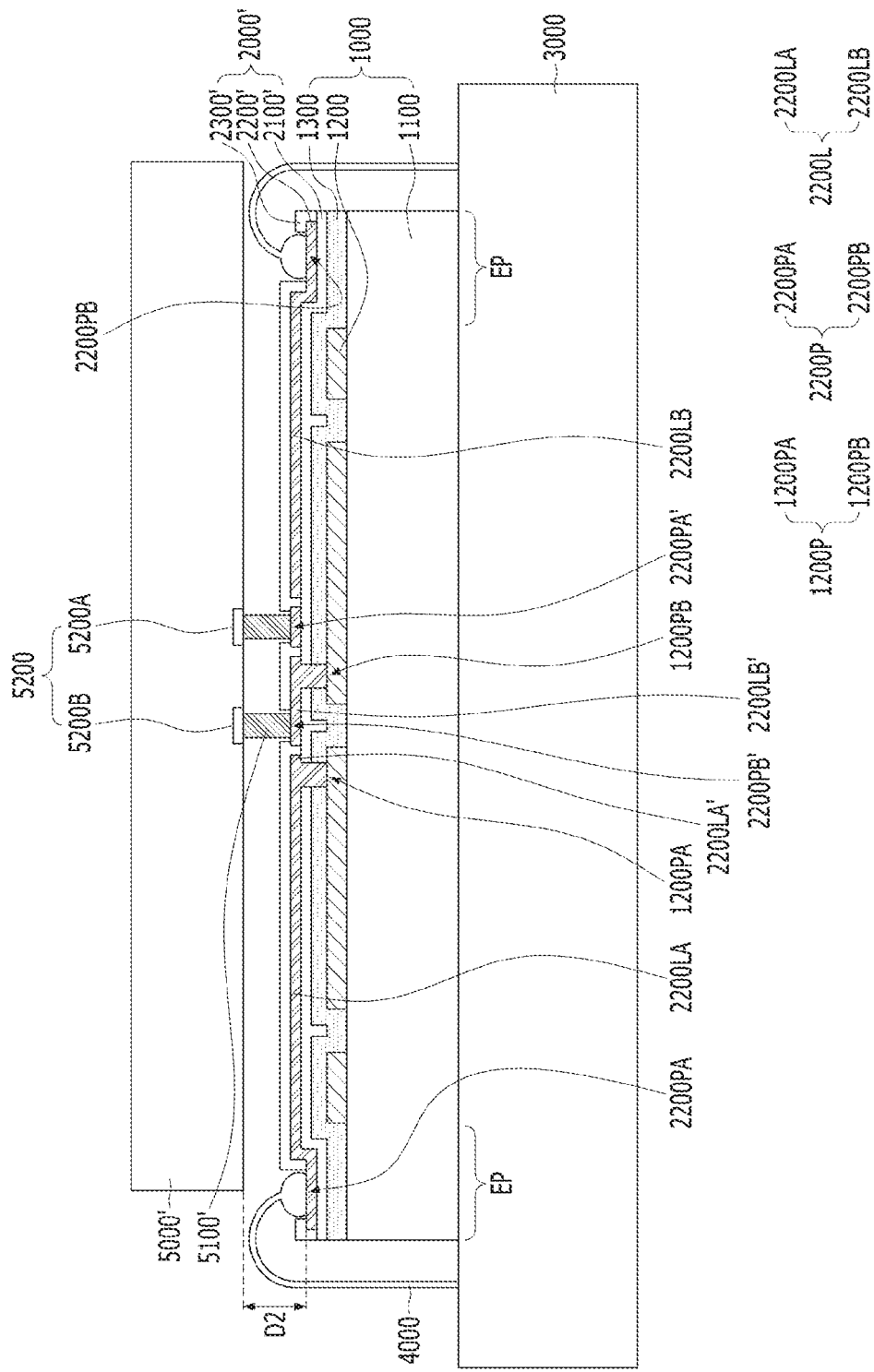
FIG. 8A is a cross-sectional view illustrating a semiconductor package according to another embodiment of the present disclosure.
Figure 8B:
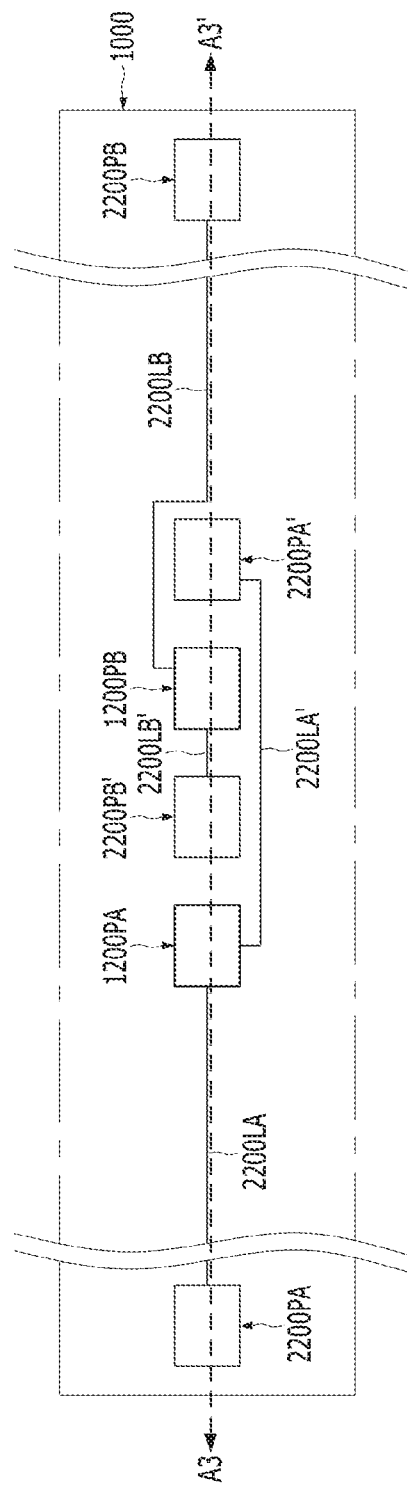
FIG. 8B is a plan view showing some of redistribution pads of a first semiconductor chip of FIG. 8A and a package redistribution conductive layer connected thereto.

FIG. 8A is a cross-sectional view illustrating a semiconductor package according to another embodiment of the present disclosure. FIG. 8A is illustrated based on a line A3-A3' of FIG. 8B. FIG. 8B is a plan view showing some of redistribution pads of a first semiconductor chip of FIG. 8A and a package redistribution conductive layer connected thereto. The redistribution pads of FIG. 8B may be two redistribution pads positioned on the line B1-B1' of FIG. 5B. FIG. 8C is a plan view showing some of chip pads of a second semiconductor chip of FIG. 8A. The chip pads of FIG. 8C may be chip pads electrically connected to the redistribution pads of FIG. 8B. The same reference numerals are assigned to substantially the same parts as the above-described embodiment, and detailed description thereof will be omitted.

Referring to FIGS. 8A to 8C, a semiconductor package according to another embodiment of the present disclosure may include a first semiconductor chip 1000 disposed over a package substrate 3000, a package redistribution layer 2000' disposed over the first semiconductor chip 1000, and a second semiconductor chip 5000' disposed over the package redistribution layer 2000' and electrically connected to the first semiconductor chip 1000 through the package redistribution layer 2000'.

The first semiconductor chip 1000 may be substantially the same as the first semiconductor chip 1000 described above. Accordingly, the first semiconductor chip 1000 may include the lower structure 1100, the redistribution conductive layer 1200 which is disposed over the lower structure 1100 and has the redistribution pads 1200P arranged in two columns in the center region of the first semiconductor chip 1000, and the protective layer 1300 which covers the lower structure 1100 and the redistribution conductive layer 1200 while exposing the redistribution pads 1200P. Hereinafter, for convenience of description, the redistribution pads 1200P disposed at one side, for example, at a left side in the two columns, will be referred to as a first redistribution pad 1200PA, and the redistribution pads 1200P disposed at the other side, for example, at a right side in the two columns, will be referred to as a second redistribution pad 1200PB.

The package redistribution layer 2000' may include a first package redistribution insulating layer 2100', a package redistribution conductive layer 2200', and a second package redistribution insulating layer 2300'.

The first package redistribution insulating layer 2100' may be substantially the same as the first package redistribution insulating layer 2100 in the above-described embodiment. That is, the first package redistribution insulating layer 2100' may cover the protective layer 1300 disposed at the uppermost portion of the first semiconductor chip 1000 while having an opening overlapping the opening of the protective layer 1300.

The package redistribution conductive layer 2200' may include substantially the same portion as the package redistribution conductive layer 2200 of the above-described embodiment. That is, the package redistribution conductive layer 2200' may include the line portion 2200L and the package redistribution pad 2200P. The line portion 2200L may be connected to the redistribution pad 1200P through the opening of the first package redistribution insulating layer 2100' and the opening of the protective layer 1300 while extending to the edge region EP of the first semiconductor chip 1000 over the first package redistribution insulating layer 2100'. The package redistribution pad 2200P may be located at the end of the line portion 2200L, and may be exposed by an opening of the second package redistribution insulating layer 2300'. Hereinafter, for convenience of description, the line portion 2200L and the package redistribution pad 2200P, which are connected to the first redistribution pad 1200PA, will be referred to as a first line portion 2200LA and a first package redistribution pad 2200PA, respectively, and the line portion 2200L and the package redistribution pad 2200P, which are connected to the second redistribution pad 1200PB, will be referred to as the second line portion 2200LB and a second package redistribution pad 2200PB, respectively.

Furthermore, the package redistribution conductive layer 2200' may include an additional first line portion 2200LA', an additional first package redistribution pad 2200PA', an additional second line portion 2200LB', and an additional second package redistribution pad 2200PB'. The additional first line portion 2200LA' may extend from the first redistribution pad 1200PA toward a direction opposite to an extension direction of the first line portion 2200LA, for example, toward a right direction. The additional first package redistribution pad 2200PA' may be disposed at an end of the additional first line portion 2200LA'. The additional second line portion 2200LB' may extend from the second redistribution pad 1200PB toward a direction opposite to an extension direction of the second line portion 2200LB, for example, toward a left direction. The additional second package redistribution pad 2200PB' may be disposed at an end of the additional second line portion 2200LB'.

The additional second package redistribution pad 2200PB' may be disposed between the first redistribution pad 1200PA and the second redistribution pad 1200PB, for example, at a left side of the second redistribution pad 1200PB. The additional first package redistribution pad 2200PA' may be disposed at an opposite side of the additional second package redistribution pad 2200PB' relative to the second redistribution pad 1200BP, for example, at a right side of the second redistribution pad 1200PB. Positions of the additional first package redistribution pad 2200PA' and the additional second package redistribution pad 2200PB' may be adjusted so that a distance between the first redistribution pad 1200PA and the second redistribution pad 1200PB is the same as a distance between the additional first package redistribution pad 2200PA' and the additional second package redistribution pad 2200PB'. That is, the additional first package redistribution pad 2200PA' and the additional second package redistribution pad 2200PB' may be disposed in a state of being moved to a predetermined degree than the first redistribution pad 1200PA and the second redistribution pad 1200PB, toward one side, for example, a right side while maintaining the distance therebetween. The additional first package redistribution pad 2200PA' and the additional second package redistribution pad 2200PB' may be formed for connection with the chip pads 5200 of the second semiconductor chip 5000'. It will be described below in corresponding paragraphs.

The second package redistribution insulating layer 2300' may cover the first package redistribution insulating layer 2100' and the package redistribution conductive layer 2200', and may have openings which expose the first package redistribution pad 2200PA, the additional first package redistribution pad 2200PA', the second package redistribution pad 2200PB, and the additional second package redistribution pad 2200PB', respectively. The first package redistribution pad 2200PA and the second package redistribution pad 2200PB may be connected to the package substrate 3000 by the bonding wire 4000. The additional first package redistribution pad 2200PA' and the additional second package redistribution pad 2200PB' may be connected to the bumps 5100' of the second semiconductor chip 5000'.

The second semiconductor chip 5000' may be a semiconductor chip of the same type as the first semiconductor chip 1000. Accordingly, the second semiconductor chip 5000' may have chip pads 5200 arranged in the same manner as the redistribution pads 1200P of the first semiconductor chip 1000. That is, the second semiconductor chip 5000' may have the chip pads 5200 arranged in two columns at its center region. However, unlike the first semiconductor chip 1000 in which the active surface on which the redistribution pads 1200P are formed is disposed to face upward, an active surface of the second semiconductor chip 5000', on which the chip pads 5200 are formed, may be disposed to face downward. Therefore, when the first redistribution pad 1200PA and the second redistribution pad 1200PB of the first semiconductor chip 1000 are disposed at the left and right sides, respectively, a first chip pad TO 5200A of the chip pads 5200 of the second semiconductor chip 5000', to be electrically connected to the first redistribution pad 1200PA, and a second chip pad 5200B of the chip pads 5200 of the second semiconductor chip 5000', to be electrically connected to the second redistribution pad 1200PB, may be disposed at the right and left sides, respectively. However, since the additional first package redistribution pad 2200PA' and the additional second package redistribution pad 2200PB' are disposed at the right and left sides, respectively, the first chip pad 5200A may be directly connected to the additional first package redistribution pad 2200PA' through the bump 5100', and the second chip pad 5200B may be directly connected to the additional second package redistribution pad 2200PB' through the bump 5100'. Meanwhile, instead of the bump 5100' of the present embodiment, various conductive interconnectors having various three-dimensional shapes, such as balls and pillars, and having upper surfaces directly contacting the first and second chip pads 5200A and 5200B, and lower surfaces directly contacting the additional first package redistribution pad 2200PA' and the additional second package redistribution pad 2200PB' may also be used.

The additional first and second package redistribution pads 2200PA' and 2200PB' may be shifted to the right by a predetermined degree, compared to the first and second redistribution pads 1200PA and 1200PB disposed in the center region of the first semiconductor chip 1000, and the first chip pad 5200A and the additional first package redistribution pad 2200PA' may overlap with each other, and the second chip pad 5200B and the additional second package redistribution pad 2200PB' may overlap with each other. As a result, the second semiconductor chip 5000' may be connected to the first semiconductor chip 1000 in a state where the second semiconductor chip 5000' is moved to the right by a predetermined degree to the first semiconductor chip 1000. Accordingly, the first semiconductor chip 1000 and the second semiconductor chip 5000' may partially overlap with each other.

The semiconductor chip and the semiconductor package including the same of the present embodiment may have all the advantages of the above-described embodiments.

Further, when the second semiconductor chip 5000' having the same type as the first semiconductor chip 1000 is formed over the first semiconductor chip 1000, and the active surface of the second semiconductor chip 5000' faces the active surface of the first semiconductor chip 1000, the connection between the first semiconductor chip 1000 and the second semiconductor chip 5000' may be facilitated.

According to the embodiments described above, a semiconductor package capable of improving defects in processes while securing reliability and operating characteristics of the semiconductor chip may be provided.

Figure 9:
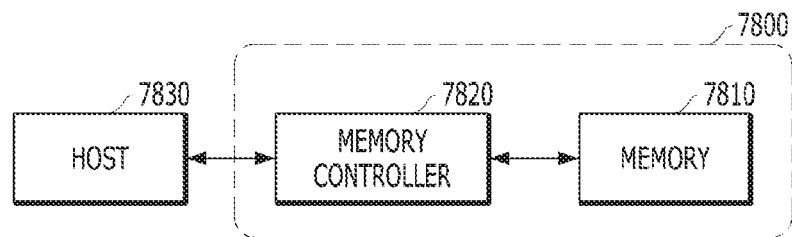
FIG. 9 shows a block diagram illustrating an electronic system employing a memory card including a semiconductor package, according to an embodiment.

FIG. 9 shows a block diagram illustrating an electronic system including a memory card 7800 employing at least one of the semiconductor packages according to the embodiments. The memory card 7800 includes a memory 7810, such as a nonvolatile memory device, and a memory controller 7820. The memory 7810 and the memory controller 7820 may store data or read out the stored data. At least one of the memory 7810 and the memory controller 7820 may include at least one of the semiconductor packages according to described embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 10:
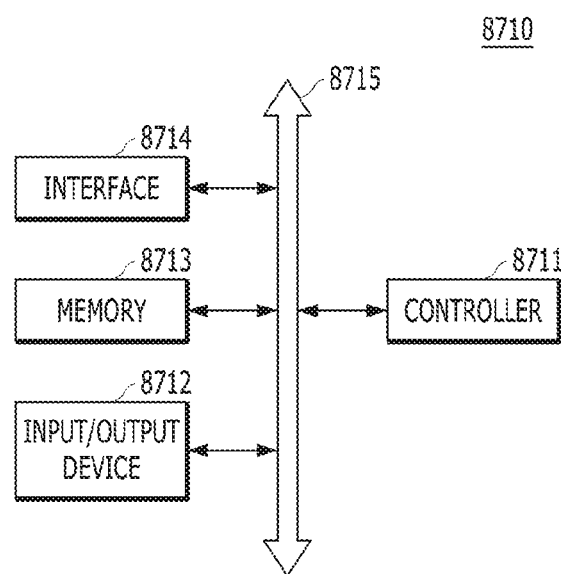
FIG. 10 shows a block diagram illustrating another electronic system including a semiconductor package, according to an embodiment.

FIG. 10 shows a block diagram illustrating an electronic system 8710 including at least one of the semiconductor packages according to described embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 represents equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution), or Wibro (wireless broadband Internet).

Although various embodiments have been described for illustrative purposes, it will be apparent to those skilled in the art that various changes and modifications may be made without departing from the spirit and scope of the disclosure as defined in the following claims.

What is claimed is:

1. A semiconductor package, comprising:
   a package substrate;
   a first semiconductor chip disposed over the package substrate and having a center region and an edge region; and
   a package redistribution layer disposed over the first semiconductor chip,
   wherein the first semiconductor chip comprises:
   a lower structure;
   a redistribution conductive layer disposed over the lower structure and electrically connected to the lower structure, the redistribution conductive layer including a redistribution pad disposed in the center region; and
   a protective layer covering the lower structure and the redistribution conductive layer, and having an opening exposing the redistribution pad,
   wherein the package redistribution layer comprises:
   a package redistribution conductive layer connected to the redistribution pad and extending to the edge region, the package redistribution conductive layer including a package redistribution pad disposed in the edge region, and,
   wherein, in the edge region, the redistribution conductive layer is omitted.

2. The semiconductor package according to claim 1, wherein the redistribution conductive layer is present in a region between the center region and the edge region.

3. The semiconductor package according to claim 1, wherein the package redistribution layer further comprises:
   a first package redistribution insulating layer positioned over the protective layer and under the package redistribution conductive layer, and having an opening overlapping the opening of the protective layer; and
   a second package redistribution insulating layer having an opening exposing the package redistribution pad while covering the first package redistribution insulating layer and the package redistribution conductive layer.

4. The semiconductor package according to claim 3, wherein the package redistribution conductive layer contacts the redistribution pad through the opening of the first package redistribution insulating layer overlapping with the opening of the protective layer.

5. The semiconductor package according to claim 3, wherein the protective layer includes an insulating material different from the first and second package redistribution insulating layers.

6. The semiconductor package according to claim 1, wherein a height of an upper surface of the package redistribution pad in the edge region is lower than a height of an upper surface of the package redistribution conductive layer overlapping the redistribution conductive layer.

7. The semiconductor package according to claim 1, wherein the protective layer is formed reflecting a profile of upper surfaces of the lower structure and the redistribution conductive layer, and
   the package redistribution conductive layer is formed reflecting a profile of an upper surface of the protective layer.

8. The semiconductor package according to claim 1, further comprising:
   a bonding wire having one end connected to an upper surface of the package redistribution pad and the other end to a surface of the package substrate.

9. The semiconductor package according to claim 1, wherein a thickness of the package redistribution conductive layer is less than a thickness of the redistribution conductive layer.

10. The semiconductor package according to claim 1, wherein the package redistribution conductive layer includes a metal material different from the redistribution conductive layer.

11. The semiconductor package according to claim wherein the lower structure includes a multi-layered conductive pattern, an interlayer insulating layer in which the multi-layered conductive pattern is embedded and having a multi-layered structure, and an insulating layer formed over the interlayer insulating layer and having a thickness greater than a thickness of any one layer of the interlayer insulating layer.

12. The semiconductor package according to claim 11, wherein the insulating layer has a higher dielectric constant or a lower moisture absorption rate than the any one layer of the interlayer insulating layer.

13. The semiconductor package according to claim 1, further comprising:
   a second semiconductor chip disposed over the package redistribution layer and connected to the package redistribution conductive layer.

14. The semiconductor package according to claim 13, wherein the second semiconductor chip includes a chip pad formed on a lower surface of the second semiconductor chip, and a conductive interconnector having an upper end connected to the chip pad and a lower end connected to the package redistribution conductive layer.

15. The semiconductor package according to claim 14, wherein the conductive interconnector includes a bump.

16. The semiconductor package according to claim 13, wherein edges of the first semiconductor chip and the second semiconductor chip are aligned with each other.

17. The semiconductor package according to claim 13, wherein the second semiconductor chip partially overlaps the first semiconductor chip.

18. The semiconductor package according to claim 13, further comprising:
- a bonding wire having one end connected to an upper surface of the package redistribution pad and the other end connected to an upper surface of the package substrate, and
- an apex of a curved portion of the bonding wire is spaced apart from the second semiconductor chip.

19. The semiconductor package according to claim 1, wherein the redistribution pad includes a first redistribution pad disposed at a first side of the center region and a second redistribution pad disposed at a second side of the center region,
- the edge region includes a first edge region relatively adjacent to the first side, and a second edge region relatively adjacent to the second side,
- the package redistribution conductive layer includes a first package redistribution conductive layer extending from the first redistribution pad to the first edge region, and a second package redistribution conductive layer extending from the second redistribution pad to the second edge region, and
- the package redistribution pad includes a first package redistribution pad disposed in the first edge region, and a second package redistribution pad disposed in the second edge region.

20. The semiconductor package according to claim 19, wherein the package redistribution pad further includes an additional first package redistribution pad and an additional second package redistribution pad,
- the additional first package redistribution pad is positioned between the first redistribution pad and the second redistribution pad, and the second redistribution pad is positioned between the additional first package redistribution pad and the additional second package redistribution pad, and
- the package redistribution conductive layer further includes an additional first package redistribution conductive layer extending from the first redistribution pad to the additional second package redistribution pad, and an additional second package redistribution conductive layer extending from the second redistribution pad to the additional first package redistribution pad.

21. The semiconductor package according to claim 20, further comprising:
- a second semiconductor chip disposed over the package redistribution layer and being the same type of semiconductor chip as the first semiconductor chip, and
- wherein the second semiconductor chip includes a first chip pad and a second chip pad formed on a lower surface of the second semiconductor chip, and conductive interconnectors connecting the first chip pad and the additional first package redistribution pad, and connecting the second chip pad and the additional second package redistribution pad.

22. The semiconductor package according to claim 1, wherein the redistribution pad includes a plurality of first redistribution pads to which the same power is applied, and
- the redistribution conductive layer includes a first redistribution conductive layer connecting the plurality of first redistribution pads to each other.

23. The semiconductor package according to claim 22, wherein the redistribution pad further includes a second redistribution pad to which power, which is different from the power applied to the plurality of first redistribution pads, is applied, and
- the redistribution conductive layer further includes a second redistribution conductive layer separated from the first redistribution conductive layer while being connected to the second redistribution pad.

* * * * *